United States Patent
Kim et al.

(10) Patent No.: US 10,094,045 B2
(45) Date of Patent: Oct. 9, 2018

(54) METHOD OF MANUFACTURING A GALLIUM NITRIDE SUBSTRATE

(71) Applicant: Samsung Electronics Co., Ltd., Suwon-si, Gyeonggi-do (KR)

(72) Inventors: Mi-Hyun Kim, Seoul (KR); Sam-Mook Kang, Hwaseong-si (KR); Jun-Youn Kim, Hwaseong-si (KR); Young-Jo Tak, Seongnam-si (KR); Young-Soo Park, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/472,467

(22) Filed: Mar. 29, 2017

(65) Prior Publication Data
US 2018/0112330 A1   Apr. 26, 2018

(30) Foreign Application Priority Data
Oct. 21, 2016 (KR) .................. 10-2016-0137596

(51) Int. Cl.
| | |
|---|---|
| *C30B 25/02* | (2006.01) |
| *C30B 25/18* | (2006.01) |
| *H01L 21/02* | (2006.01) |
| *H01L 21/78* | (2006.01) |
| *C30B 25/10* | (2006.01) |
| *C30B 29/40* | (2006.01) |
| *C30B 29/06* | (2006.01) |
| *C30B 25/16* | (2006.01) |

(52) U.S. Cl.
CPC ............ *C30B 25/186* (2013.01); *C30B 25/02* (2013.01); *C30B 25/10* (2013.01); *C30B 25/16* (2013.01); *C30B 25/183* (2013.01); *C30B 29/06* (2013.01); *C30B 29/406* (2013.01); *H01L 21/0254* (2013.01); *H01L 21/0262* (2013.01); *H01L 21/02381* (2013.01); *H01L 21/02458* (2013.01); *H01L 21/02658* (2013.01); *H01L 21/7806* (2013.01)

(58) Field of Classification Search
CPC ...... Y10S 117/915; C30B 25/02; C30B 25/16; C30B 29/38
See application file for complete search history.

(56) References Cited

U.S. PATENT DOCUMENTS

| | | | | |
|---|---|---|---|---|
| 5,679,152 A | * | 10/1997 | Tischler ............... | B82Y 15/00 117/1 |
| 6,824,610 B2 | * | 11/2004 | Shibata ............... | C30B 25/02 117/106 |

(Continued)

FOREIGN PATENT DOCUMENTS

| | | |
|---|---|---|
| JP | 2009238803 A | 10/2009 |
| KR | 100912313 B | 8/2009 |
| KR | 101178504 B | 8/2012 |

*Primary Examiner* — Robert M Kunemund
(74) *Attorney, Agent, or Firm* — Harness, Dickey & Pierce, P.L.C.

(57) ABSTRACT

In a method of manufacturing a GaN substrate, a capping layer may be formed on a first surface of a silicon substrate. A buffer layer may be formed on a second surface of the silicon substrate. The second surface may be opposite the first surface. A GaN substrate may be formed on the buffer layer by performing a hydride vapor phase epitaxy (HVPE) process. The capping layer and the silicon substrate may be removed.

20 Claims, 8 Drawing Sheets

(56) References Cited

U.S. PATENT DOCUMENTS

| | | | |
|---|---|---|---|
| 7,459,023 B2 | 12/2008 | Yamazaki et al. | |
| 7,501,023 B2 * | 3/2009 | Dmitriev | C30B 25/00 117/106 |
| 7,842,134 B2 * | 11/2010 | Whitehead | H01L 21/02381 117/101 |
| 9,006,083 B1 | 4/2015 | Kumar | |
| 9,048,169 B2 | 6/2015 | Arena | |

* cited by examiner

METHOD OF MANUFACTURING A GALLIUM NITRIDE SUBSTRATE

CROSS-REFERENCE TO RELATED APPLICATION

This application claims priority under 35 USC § 119 to Korean Patent Application No. 10-2016-0137596, filed on Oct. 21, 2016 in the Korean Intellectual Property Office (KIPO), the contents of which are herein incorporated by reference in their entirety.

BACKGROUND

1. Field

Example embodiments relate to a method of manufacturing a gallium nitride (GaN) substrate. More particularly, example embodiments relate to a method of manufacturing a GaN substrate having a large-area.

2. Description of the Related Art

A GaN substrate may serve as a substrate of a short-wavelength light-emitting device. In general, a sapphire substrate may be used as a seed substrate for manufacturing the GaN substrate. However, a difference between thermal expansion coefficients of sapphire and GaN may be relatively great, so that the GaN substrate formed on the sapphire substrate may be broken during a temperature lowering process. After the GaN is grown on a silicon substrate serving as a seed substrate, the silicon substrate may be removed in-situ while maintaining a relatively high temperature. In this case, the breakage of the GaN substrate due to a difference between thermal expansion coefficients of silicon and GaN may decrease. However, when the GaN substrate is grown on the silicon substrate, a silicon nitride layer may be formed beneath the silicon substrate. Due to the silicon nitride layer, the silicon substrate may not be easily removed, and thus, the GaN substrate may be broken.

SUMMARY

Example embodiments provide a method of manufacturing a GaN substrate using a silicon substrate as a seed substrate.

According to example embodiments, there is provided method of manufacturing a GaN substrate. A capping layer is formed on a first surface of a silicon substrate. A buffer layer is formed on a second surface of silicon substrate. The second surface is opposite the first surface. A GaN substrate is formed on the buffer layer by performing a hydride vapor phase epitaxy (HVPE) process. The capping layer and the silicon substrate are removed.

According to example embodiments, there is provided method of manufacturing a GaN substrate. A capping layer is formed on a first surface of a silicon substrate. A GaN substrate is formed on a second surface of the silicon substrate. The second surface is opposite the first surface. The capping layer and the silicon substrate are dry etched.

According to example embodiments, there is provided a method of manufacturing a GaN substrate. A nitride blocking layer is formed covering a first surface of a silicon substrate. A GaN substrate is formed on a second surface of the silicon substrate. The second surface is opposite the first surface. The nitride blocking layer is removed together with the silicon substrate.

In accordance with example embodiments, the GaN substrate having a relatively large area may be manufactured at a relatively low cost using the silicon substrate as the seed substrate. The capping layer may be formed on the first surface of the silicon substrate, and thus, a silicon nitride layer may not be formed on the first surface of the silicon substrate during a growth process for forming the GaN substrate. Thus, failures of the GaN substrate due to the silicon nitride layer, e.g., cracks or a breakage, etc., may decrease.

BRIEF DESCRIPTION OF THE DRAWINGS

Example embodiments will be more clearly understood from the following detailed description taken in conjunction with the accompanying drawings.

FIGS. 1 to 6 are cross-sectional views illustrating stages of a method of manufacturing a GaN substrate in accordance with example embodiments;

FIGS. 7 and 8 are cross-sectional views illustrating stages of a method of manufacturing a GaN substrate in accordance with example embodiments;

FIGS. 9 to 13 are cross-sectional views illustrating stages of a method of manufacturing a GaN substrate in accordance with example embodiments;

FIG. 14 is an XPS (x-lay photoelectron spectroscopy) of each of a bare silicon substrate and a GaN layer on a silicon substrate;

FIG. 15 is a photograph of a GaN substrate including failures according to a comparative example; and FIG. 16 is a photograph of a surface of a silicon substrate after etching a capping layer and a portion of the silicon substrate according to example embodiments.

DETAILED DESCRIPTION

FIGS. 1 to 6 are cross-sectional views illustrating stages of a method of manufacturing a GaN substrate in accordance with example embodiments.

Figure 1:
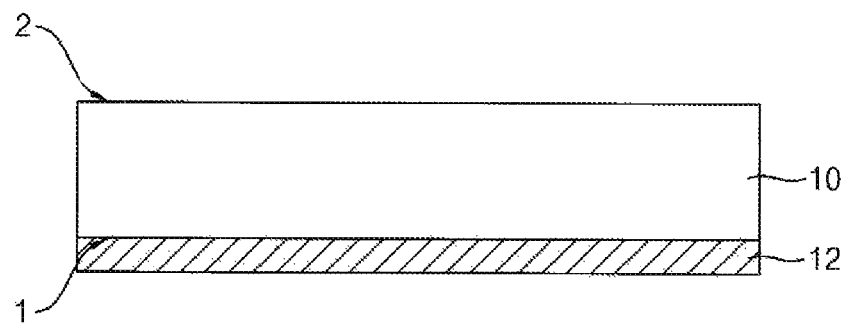
FIGS. 1 to 16 represent non-limiting, example embodiments as described herein.

Referring to FIG. 1, a silicon substrate 10 may include a second surface 2 on which a GaN substrate 16 (refer to FIG. 3) is formed and a first surface 1 opposite the second surface 2. A capping layer 12 may be formed on the first surface 1 of the silicon substrate 10 to entirely cover the first surface 1 of the silicon substrate 10.

The silicon substrate 10 may serve as a seed substrate (or a template substrate) for forming the GaN substrate 16. Thus, a diameter of the GaN substrate 16 subsequently formed may be determined by a diameter of the silicon substrate 10.

The silicon substrate 10 may have a relatively large area. In example embodiments, the silicon substrate 10 may have a thickness of about 100 µm to about 1000 µm, and may have a diameter equal to or more than about 6 inches, e.g., about 6 inches to about 18 inches. Thus, the GaN substrate 16 formed on the silicon substrate 10 may have a relatively large area equal to or more than about 6 inches. However, in some example embodiments, the silicon substrate 10 having the diameter equal to or more than about 6 inches may not be used. That is, a GaN substrate 16 having a relatively small area may be manufactured using the silicon substrate 10 having a smaller area of less than about 6 inches.

In general, a sapphire substrate may serve as the seed substrate for forming the GaN substrate 16. However, the sapphire substrate may be more expensive than the silicon substrate 10, and may have a diameter smaller than a diameter of the silicon substrate 10. Therefore, the silicon substrate 10 may be more suitable as a seed substrate for forming the GaN substrate 16 having a relatively large area.

The capping layer 12 may serve as a nitride blocking layer for reducing or preventing from a nitridation of the first surface 1 of the silicon substrate 10 in a subsequent growth process for forming the GaN substrate 16. That is, the capping layer 12 may be formed on the first surface 1 of the silicon substrate 10, and thus, the first surface 1 of the silicon substrate 10 may not be exposed. Also, nitrogen source gas may not be introduced onto the first surface 1 of the silicon substrate 10.

The capping layer 12 may be formed of a material that may be more easily etched in a subsequent etching process for removing the silicon substrate 10. In example embodiments, the capping layer 12 may be formed of a material that may be more easily etched by a chlorine-based etching gas, e.g., $Cl_2$, HCl, etc.

The capping layer 12 may include a metal or a metal nitride. In example embodiments, the capping layer 12 may include, e.g., titanium (Ti), zirconium (Zr), hafnium (Hf), molybdenum (Mo), manganese (Mn), nickel (Ni), zinc (Zn), chromium (Cr), Gallium (Ga), aluminum (Al), indium (In), or a nitride thereof The capping layer 12 may be formed by an atomic layer deposition (ALD) process, a sputtering process, or a chemical vapor deposition (CVD) process. If the capping layer 12 has a thickness of less than about 0.1 nm, the nitrogen source gas may be introduced onto the silicon substrate 10. If the capping layer 12 has a thickness of less than about 100 μm, the time for removing the capping layer 12 may be increased. Thus, the capping layer 12 may be formed to have a thickness of about 0.1 nm to about 100 μm.

Figure 2:
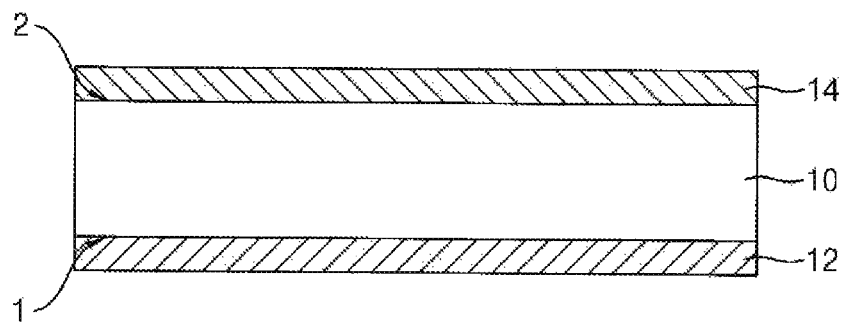

Referring to FIG. 2, a buffer layer 14 may be formed on the second surface 2 of the silicon substrate 10 to entirely cover the second surface 2 of the silicon substrate 10.

The buffer layer 14 may be formed to reduce cracks and/or melt-back of the GaN substrate 16 during a subsequent growth process for forming the GaN substrate 16.

The buffer layer 14 may be formed of a material having a lattice constant different from the lattice constants of silicon and GaN by a relatively small amount. In the subsequent growth process for forming the GaN substrate 16, a tensile stress may be generated due to the difference between the lattice constants of silicon and GaN, and thus, the cracks of the GaN substrate 16 may be generated by the tensile stress. However, in example embodiments, the buffer layer 14 may be formed between the silicon substrate 10 and the GaN substrate 16. Thus, the tensile stress of the GaN substrate 16 may decrease, so that the cracks of the GaN substrate 16 may decrease.

When the GaN substrate 16 is grown directly on the silicon substrate 10, silicon may be diffused into the GaN substrate 16 so that a surface of the silicon substrate 10 may be etched. This phenomenon may be called as melt-back. The buffer layer 14 may be formed between the silicon substrate 10 and the GaN substrate 16, so that the diffusion of silicon into the GaN substrate 16 may decrease. Thus, the melt-back phenomenon may decrease.

In example embodiments, the buffer layer 14 may be formed of at least one of AlN, TaN, TiN, HfN, GaN, and AlGaN. For example, the buffer layer 14 may be formed to include a multiple layer, e.g., an AlN layer, an AlGaN layer, and a GaN layer sequentially stacked. The buffer layer 14 may be formed to have a thickness of, e.g., about 5 nm to about 50 μm. The buffer layer 14 may be formed by a metal organic chemical vapor deposition (MOCVD) process or a hydride vapor phase epitaxy (HVPE) process.

Figure 3:
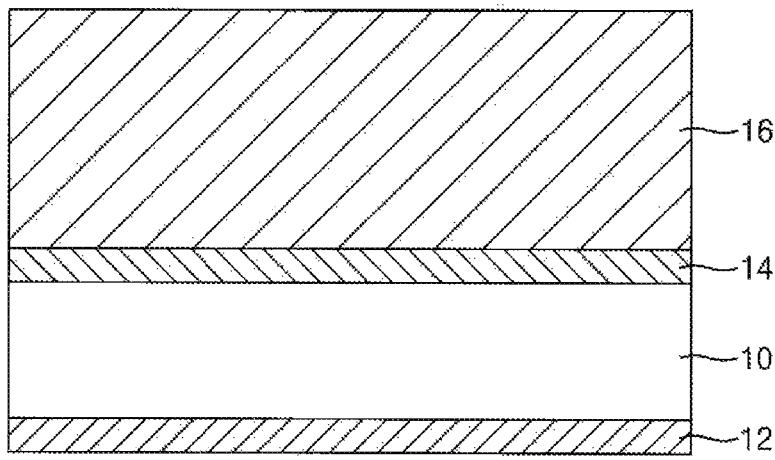

Referring to FIG. 3, the GaN substrate 16 may be formed on the buffer layer 14 by an epitaxial growth process. In example embodiments, a diameter of the GaN substrate 16 may be substantially the same as a diameter of the silicon substrate 10.

In example embodiments, the GaN substrate 16 may be formed by an HVPE process. The GaN substrate 16 may include single crystalline GaN.

When the GaN substrate 16 is formed by the HVPE process, a growth rate of the GaN may be higher than a growth rate of GaN by an MOCVD process. Thus, the HVPE process may be performed when forming a relatively large-area GaN substrate having a diameter equal to or more than 6 inches.

In example embodiments, hydrogen chloride (HCl) and Ga may be reacted with each other to form gallium chloride (GaCl) in an HVPE reactor, and the GaCl may be reacted with ammonia ($NH_3$) in the HVPE reactor to form the GaN substrate 16 on the buffer layer 14. The growth process for forming the GaN substrate 16 may be performed at a temperature of about 950° C. to about 1200° C. The GaN substrate 16 may have a thickness of about 5 μm to about 10 cm.

After forming the GaN substrate 16, the capping layer 12 may entirely cover the first surface 1 of the silicon substrate 10. Thus, the first surface 1 of the silicon substrate 10 may not be exposed. In example embodiments, the capping layer 12 may not be removed during the formation of the GaN substrate 16. Alternatively, the capping layer 12 may be removed by a given or predetermined thickness during the formation of the GaN substrate 16.

When the GaN substrate 16 is formed by the HVPE process, a nitrogen gas, e.g., $NH_3$ gas, may be introduced into the HVPE reactor. If the first surface 1 of the silicon substrate 10 is exposed during the growth process for forming the GaN substrate 16, the nitrogen gas may be reacted with the first surface 1 of the silicon substrate 10 to form a silicon nitride layer having a non-uniform thickness on the first surface 1 of the silicon substrate 10. That is, the silicon nitride layer may be formed on portions of the first surface 1 of the silicon substrate 10. The silicon nitride layer may not be removed by a subsequent removal process of the silicon substrate 10, so that cracks and/or breakage of the GaN substrate 16 due to the silicon nitride layer may be generated.

However, as described above, the capping layer 12 may entirely cover the first surface 1 of the silicon substrate 10, so that the nitrogen gas may not react with the first surface 1 of the silicon substrate 10 during the growth process for forming the GaN substrate 16. Thus, the silicon nitride layer may not be formed on the first surface 1 of the silicon substrate 10.

In some example embodiments, the nitrogen gas may be reacted with a surface of the capping layer 12 during the growth process for forming the GaN substrate 16, so that a nitride layer may be formed on the capping layer 12.

Figure 4:
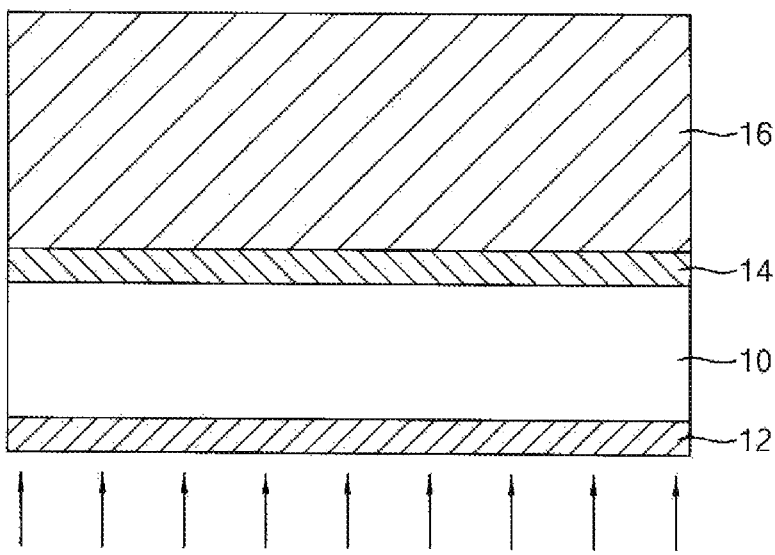
Figure 5:
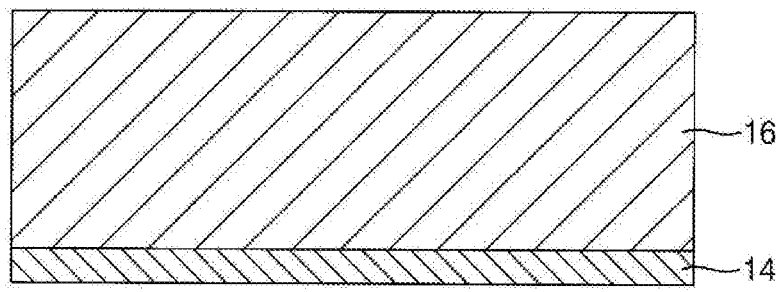

Referring to FIGS. 4 and 5, the capping layer 12 and the silicon substrate 10 may be removed. Thus, the buffer layer 14 may be exposed.

The removal process of the capping layer 12 and the silicon substrate 10 may be performed in-situ at the HVPE reactor for forming the GaN substrate 16.

The capping layer 12 and the silicon substrate 10 may be removed by a dry etching process having substantially the same process conditions. The capping layer 12 and the silicon substrate 10 may be etched using a chlorine-based etching gas, e.g., $Cl_2$, HCl, etc. The capping layer 12 and the silicon substrate 10 may be removed at a temperature of about 500° C. to about 1200° C.

A silicon nitride layer may not be easily etched by the chlorine-based etching gas. Thus, when the silicon nitride layer is formed on the first surface 1 of the silicon substrate 10, the silicon nitride layer may serve as an etching mask during the removal process of the capping layer 12 and the silicon substrate 10. That is, a portion of the silicon substrate 10 on which the silicon nitride layer may be formed may not be etched by the chlorine-based etching gas, and may remain after the removal process using the chlorine-based etching gas. Silicon may have a thermal expansion coefficient different from a thermal expansion coefficient of GaN. Thus, when a temperature of the GaN substrate 16 is lowered after removing the silicon substrate 10, the cracks and/or the breakage of the GaN substrate 16 may be generated by a difference between the thermal expansion coefficients of the remaining silicon and GaN.

However, in example embodiments, the capping layer 12 may be formed on the first surface 1 of the silicon substrate 10, so that the silicon nitride layer may not be formed on the first surface 1 of the silicon substrate 10. The capping layer 12 and the silicon substrate 10 may be uniformly etched by the chlorine-based etching gas, so that the silicon substrate 10 may not remain on the GaN substrate 16, after the removal process.

Figure 6:
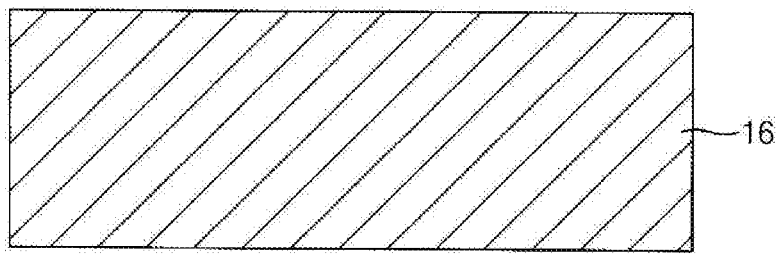

Referring to FIG. 6, the buffer layer 14 may be removed.

In example embodiments, the buffer layer 14 may be removed by a grinding process or an etching process. In some example embodiments, the buffer layer 14 may also be removed simultaneously with the capping layer 12 and the silicon substrate 10.

Thus, the free-standing GaN substrate 16 may be manufactured. The GaN substrate 16 may have a flat surface.

As described above, in the manufacturing of the GaN substrate 16, failures, e.g., the melt-back, cracks, breakage, etc., may decrease.

Figure 7:
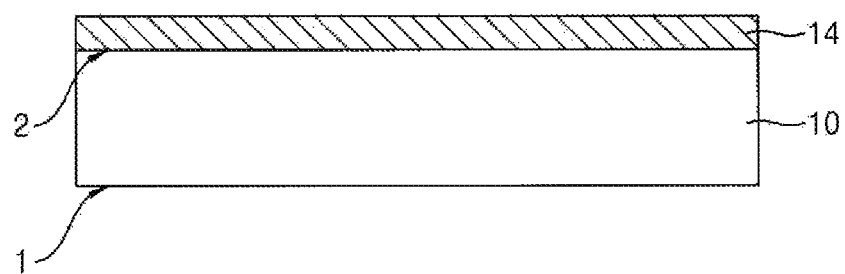
Figure 8:
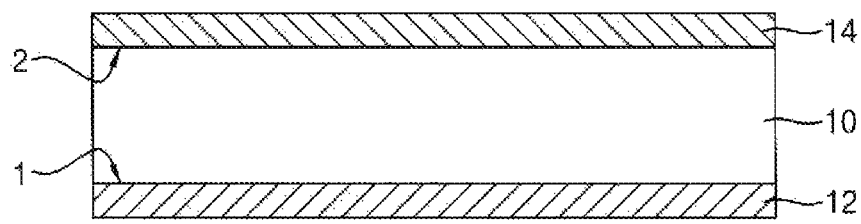

FIGS. 7 and 8 are cross-sectional views illustrating stages of a method of manufacturing a GaN substrate in accordance with example embodiments.

Processes of manufacturing the GaN substrate may be substantially the same as those illustrated with reference to FIGS. 1 to 6, except that the buffer layer 14 may be formed on the second surface 2 of the silicon substrate 10 and the capping layer 12 may be formed on the first surface 1 of the silicon substrate 10.

Referring to FIG. 7, the silicon substrate 10 may be provided.

The buffer layer 14 may be formed on the second surface 2 of the silicon substrate 10 to entirely cover the second surface 2 of the silicon substrate 10. The buffer layer 14 may be formed by processes illustrated with reference to FIG. 2.

Referring to FIG. 8, the capping layer 12 may be formed on the first surface 1 of the silicon substrate 10 to entirely cover the first surface 1 of the silicon substrate 10. The capping layer 12 may be formed by processes illustrated with reference to FIG. 1.

Then, processes illustrated with reference to FIGS. 3 to 6 may be performed to form the free-standing GaN substrate 16 shown in FIG. 6.

FIGS. 9 to 13 are cross-sectional views illustrating stages of a method of manufacturing a GaN substrate in accordance with example embodiments.

First, processes illustrated with reference to FIGS. 1 and 2 may be performed. Thus, the capping layer 12 may be formed on the first surface 1 of the silicon substrate 10 and the buffer layer 14 may be formed on the second surface 2 of the silicon substrate 10. In some example embodiments, the buffer layer 14 may be formed on the second surface 2 of the silicon substrate 10, and then the capping layer 12 may be formed on the first surface 1 of the silicon substrate 10.

Figure 9:
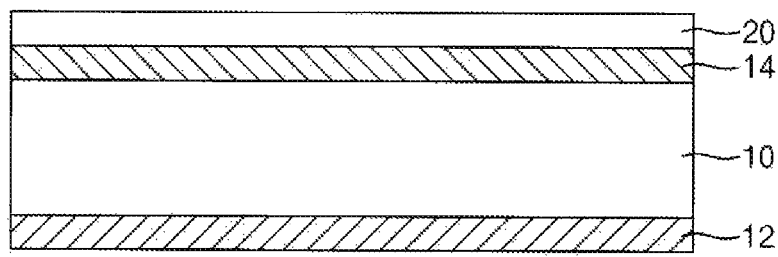

Referring to FIG. 9, an insulation layer 20 may be formed on the buffer layer 14. The insulation layer 20 may be formed by a CVD process or a sputtering process. The insulation layer 20 may include, e.g., silicon oxide, silicon nitride, aluminum oxide, hafnium oxide, etc.

The insulation layer 20 may have a thickness of about 1 nm to about 100 μm.

The insulation layer 20 may cover cracks in the buffer layer 14.

Figure 10:
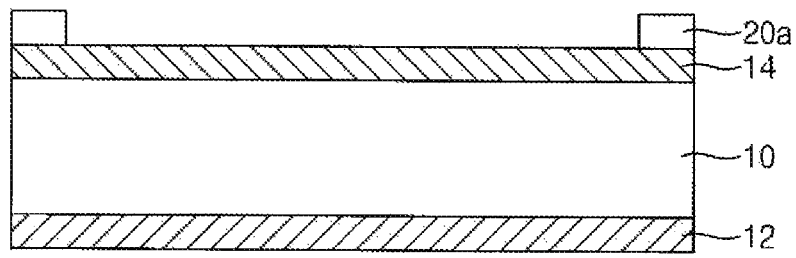

Referring to FIG. 10, the insulation layer 20 may be patterned by a photo process and an etching process to form an insulation pattern 20a surrounding an upper edge surface of the buffer layer 14. The etching process may include a wet etching process and/or a dry etching process.

Thus, an upper central surface of the buffer layer 14 may be exposed by the insulation pattern 20a. A GaN substrate may be subsequently formed on the exposed upper surface of the buffer layer 14, and thus, the insulation pattern 20a may define a region of the GaN substrate. The insulation pattern 20a may cover cracks in the upper edge surface of the buffer layer 14.

Figure 11:
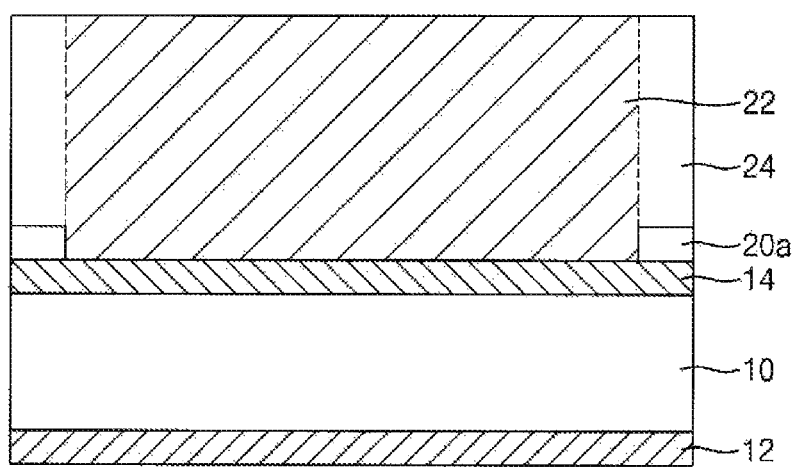

Referring to FIG. 11, GaN may be grown on the exposed upper surface of the buffer layer 14 by an epitaxial growth process to form a first GaN layer 22 on the buffer layer 14 and a second GaN layer 24 on the insulation pattern 20a.

In example embodiments, the first and second GaN layers 22 and 24 may be formed by an HVPE process. The first and second GaN layers 22 and 24 may be formed by performing processes illustrated with reference to FIG. 3.

When the HVPE process is performed, the single crystalline first GaN layer 22 may be formed on the buffer layer 14, and the polycrystalline second GaN layer 24 may be formed on the insulation pattern 20a. The first GaN layer 22 on the buffer layer 14 may be transformed to a single crystalline GaN substrate by performing subsequent processes.

The insulation pattern 20a may cover the cracks of the upper edge surface of the buffer layer 14, so that melt-back due to the cracks may decrease during forming the first and second GaN layers 22 and 24.

Figure 12:
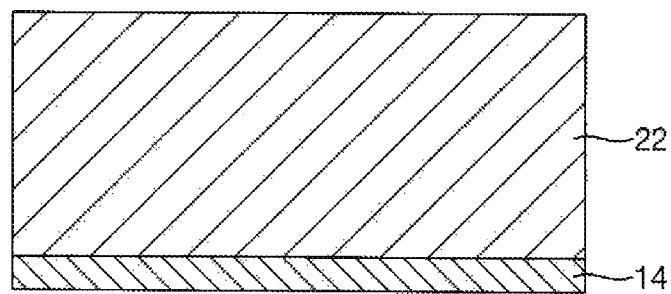

Referring to FIG. 12, the capping layer 12 and the silicon substrate 10 may be removed. The removal process of the capping layer 12 and the silicon substrate 10 may be substantially the same as processes illustrated with reference to FIGS. 4 and 5.

The single crystalline first GaN layer 22 and the polycrystalline second GaN layer 24 may be more easily separated from each other. In example embodiments, the first and second GaN layers 22 and 24 may be separated from each other during the removal process of the capping layer 12 and the silicon substrate 10. Also, the insulation pattern 20a on the buffer layer 14 may be separated from the first GaN layer 22 during the removal process of the capping layer 12 and the silicon substrate 10. Thus, the buffer layer 14 may remain on the first GaN layer 22.

Figure 13:
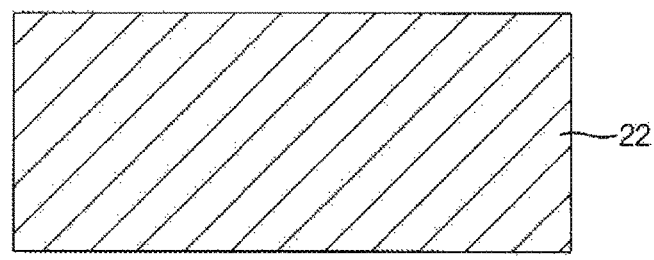

Referring to FIG. 13, the buffer layer 14 may be removed. The removal process may be substantially the same as that of the illustrated with reference to FIG. 6. Thus, the single crystalline first GaN layer 22 may remain, and may serve as a free-standing GaN substrate.

Figure 14:
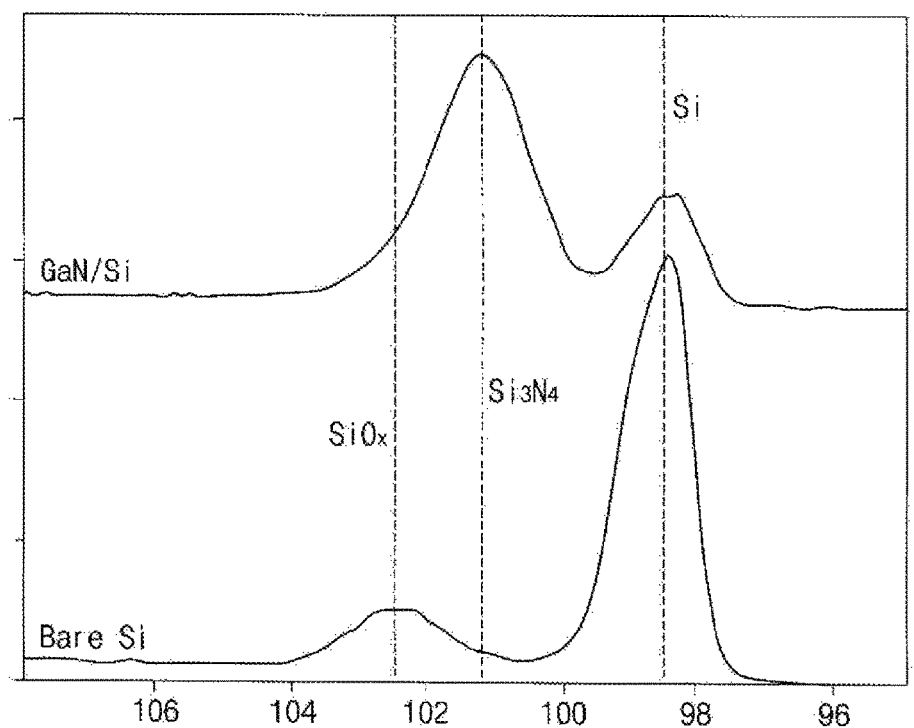

FIG. 14 is an X-ray photoelectron spectroscopy (XPS) of a GaN layer on a silicon substrate and a bare silicon substrate.

A first surface of the bare silicon substrate was observed by the XPS. The GaN layer was formed on a second surface of a silicon substrate by an HVPE process, and a first surface of the silicon substrate was observed by the XPS.

Referring to FIG. 14, silicon and natural oxide were detected on the first surface of the bare silicon substrate. Also, silicon and silicon nitride were detected on the first surface of the silicon substrate on which the GaN layer was formed. According to the experiment, a silicon nitride layer was formed on the first surface of the silicon substrate on which the GaN layer was formed.

Figure 15:
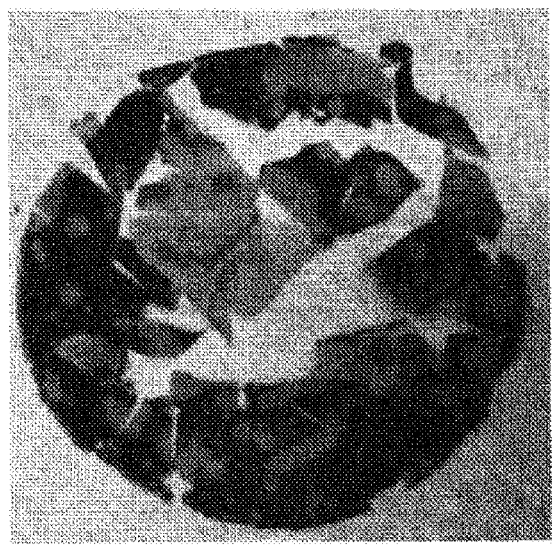

FIG. 15 is a photograph of a GaN substrate including failures according to a comparative example.

A GaN substrate may be formed on a first surface of a silicon substrate by an HVPE process, and the silicon substrate may be etched by a chlorine-based etching gas.

Referring to FIG. 15, a silicon nitride layer is unevenly formed on the first surface of the silicon substrate. A portion of the silicon substrate on which the silicon nitride layer is formed may not be removed, so that silicon may non-uniformly remain on the GaN substrate. Thus, the GaN substrate may be broken by stresses due to a difference between thermal expansion coefficients of silicon and GaN.

Figure 16:
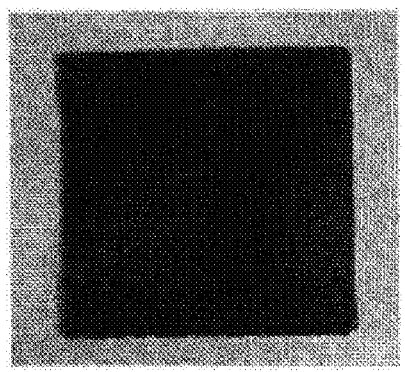

FIG. 16 is a photograph of a surface of a silicon substrate after etching a capping layer and a portion of the silicon substrate according to example embodiments.

A capping layer was formed on a silicon substrate. The capping layer included a titanium nitride layer. A nitridation process for introducing nitrogen gas onto the capping layer was performed. The capping layer was removed by HCl.

Referring to FIG. 16, the capping layer was completely removed by the HCl. A surface of the silicon substrate was uniformly etched. Thus, as the capping layer was formed on the silicon substrate, the surface of the silicon substrate was not nitridated in the nitridation process.

As described above, a free-standing GaN substrate having a relatively large area may be manufactured.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a gallium nitride (GaN) substrate, the method comprising:
   forming a capping layer on a first surface of a silicon substrate;
   forming a buffer layer on a second surface of the silicon substrate, the second surface being opposite the first surface;
   forming a GaN substrate on the buffer layer by performing a hydride vapor phase epitaxy (HVPE) process; and
   removing the capping layer and the silicon substrate.

2. The method of claim 1, wherein the removing the capping layer removes the capping layer by a chlorine-based etching gas.

3. The method of claim 1, wherein the forming a capping layer forms the capping layer of at least one of titanium (Ti), zirconium (Zr), hafnium (Hf), molybdenum (Mo), manganese (Mn), nickel (Ni), copper (Cu), zinc (Zn), chromium (Cr), Gallium (Ga), aluminum (Al), indium (In), and a nitride thereof.

4. The method of claim 1, wherein the forming a capping layer forms the capping layer by an atomic layer deposition (ALD) process, a sputtering process or a chemical vapor deposition (CVD) process.

5. The method of claim 1, wherein the forming a GaN substrate forms the GaN substrate at a temperature of about 950° C. to 1200° C. by performing the HVPE process.

6. The method of claim 1, wherein the removing the capping layer and the silicon substrate removes the capping layer and the silicon substrate by the same dry etching process using a chlorine-based etching gas.

7. The method of claim 6, wherein the chlorine-based etching gas includes HCl or $Cl_2$.

8. The method of claim 1, wherein the removing the capping layer and the silicon substrate removes the capping layer and the silicon substrate in an HVPE reactor where the GaN substrate is formed.

9. The method of claim 1, wherein the forming a buffer layer forms the buffer layer of at least one of AlN, TaN, TiN, HfN, GaN and AlGaN.

10. The method of claim 1, wherein the forming a buffer layer forms the buffer layer by a metal organic chemical vapor deposition (MOCVD) process or an HVPE process.

11. The method of claim 1, further comprising:
    forming an insulation pattern surrounding an edge surface of the buffer layer after the forming a buffer layer.

12. A method of manufacturing a GaN substrate, the method comprising:
    forming a capping layer on a first surface of a silicon substrate;
    forming a GaN substrate on a second surface of the silicon substrate, the second surface being opposite the first surface; and
    dry etching the capping layer and the silicon substrate.

13. The method of claim 12, wherein the forming a capping layer forms the capping layer of at least one of titanium (Ti), zirconium (Zr), hafnium (Hf), molybdenum (Mo), manganese (Mn), nickel (Ni), copper (Cu), zinc (Zn), chromium (Cr), Gallium (Ga), aluminum (Al), indium (In), and a nitride thereof.

14. The method of claim 12, wherein the dry etching the capping layer and the silicon substrate removes the capping layer and the silicon substrate in an HVPE reactor where the GaN substrate is formed.

15. The method of claim 12, further comprising:
    forming a buffer layer on the second surface of the silicon substrate after or before the forming a capping layer.

16. A method of manufacturing a gallium nitride (GaN) substrate, the method comprising:
    forming a nitride blocking layer covering a first surface of a silicon substrate;
    forming a GaN substrate on a second surface of the silicon substrate, the second surface being opposite the first surface; and removing the nitride blocking layer together with the silicon substrate.

17. The method of claim 16, wherein the removing the nitride blocking layer together with the silicon substrate removes the nitride blocking layer and the silicon substrate by a dry etching process using a chlorine-based etching gas.

18. The method of claim 16, wherein the forming a nitride blocking layer forms the nitride blocking layer of at least one of titanium (Ti), zirconium (Zr), hafnium (Hf), molybdenum (Mo), manganese (Mn), nickel (Ni), copper (Cu), zinc (Zn), chromium (Cr), Gallium (Ga), aluminum (Al), indium (In), and a nitride thereof.

19. The method of claim 16, wherein the forming a nitride blocking layer forms the nitride blocking layer by an atomic layer deposition (ALD) process, a sputtering process or a chemical vapor deposition (CVD) process.

20. The method of claim 16, wherein the forming a GaN substrate forms the GaN substrate at a temperature of about 950° C. to 1200° C. by performing a HVPE process.

* * * * *